United States Patent
Rivet et al.

(10) Patent No.: US 10,045,420 B2
(45) Date of Patent: Aug. 7, 2018

(54) CURRENT BALANCING SYSTEM FOR SEMICONDUCTOR ELEMENTS IN PARALLEL

(71) Applicant: STMICROELECTRONICS (TOURS) SAS, Tours (FR)

(72) Inventors: Bertrand Rivet, Vouvray (FR); David Jouve, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 25 days.

(21) Appl. No.: 14/838,519

(22) Filed: Aug. 28, 2015

(65) Prior Publication Data

US 2016/0181907 A1    Jun. 23, 2016

(30) Foreign Application Priority Data

Dec. 17, 2014 (FR) .................................. 14 62572

(51) Int. Cl.

| | |
|---|---|
| *H05B 37/02* | (2006.01) |
| *H05B 33/08* | (2006.01) |
| *G05F 1/577* | (2006.01) |
| *H03K 17/12* | (2006.01) |
| *H03K 17/74* | (2006.01) |
| *H03K 17/14* | (2006.01) |

(52) U.S. Cl.
CPC ......... *H05B 33/0887* (2013.01); *G05F 1/577* (2013.01); *H03K 17/12* (2013.01); *H03K 17/74* (2013.01); *H05B 33/0815* (2013.01); *H03K 17/14* (2013.01)

(58) Field of Classification Search
CPC .............. H05B 33/0284; H05B 33/083; H05B 33/0809; H05B 33/0848; H05B 33/0815; H05B 33/0851; H05B 33/0887; H05B 37/02; H05B 37/029; H05B 6/682; H05B 1/02; H05B 33/0818; H05B 33/0836; H05B 39/04; H05B 41/36; H05B 41/3921; H05B 41/3927
USPC ........ 315/185 R, 186, 193, 200 R, 291, 297, 315/307, 308
See application file for complete search history.

(56) References Cited

U.S. PATENT DOCUMENTS

| | | | |
|---|---|---|---|
| 7,847,783 B2 * | 12/2010 | Liu ....................... | G09G 3/342 315/167 |
| 8,674,621 B2 | 3/2014 | Ge et al. | |
| 2001/0054848 A1 | 12/2001 | Baudelot et al. | |
| 2009/0187925 A1 | 7/2009 | Hu et al. | |
| 2011/0074839 A1 | 3/2011 | Liu et al. | |

(Continued)

FOREIGN PATENT DOCUMENTS

| | | |
|---|---|---|
| CN | 101668363 | 3/2010 |
| CN | 101674693 | 3/2010 |
| CN | 101702849 | 5/2010 |

*Primary Examiner* — Nguyen Tran
(74) *Attorney, Agent, or Firm* — Slater Matsil, LLP

(57) ABSTRACT

A circuit is for balancing currents flowing through a parallel assembly of semiconductor components of the same type. The circuit may include a respective regulation circuit for each semiconductor component. Each regulation circuit may include a comparator of a first signal representative of the current flowing through the component with a reference signal, and a resistive element of a changeable resistance and controlled by the comparator.

21 Claims, 2 Drawing Sheets

(56) References Cited

U.S. PATENT DOCUMENTS

2013/0009556 A1* 1/2013 Szczeszynski ........... H03K 7/08
　　　　　　　　　　　　　　　　　　　　315/185 R
2013/0249424 A1 　9/2013 Park et al.
2014/0375224 A1* 12/2014 Jung ................... H05B 33/083
　　　　　　　　　　　　　　　　　　　　315/193

* cited by examiner

CURRENT BALANCING SYSTEM FOR SEMICONDUCTOR ELEMENTS IN PARALLEL

This application claims the priority benefit of French Patent application number 14/62572, filed on Dec. 17, 2014, which is hereby incorporated herein in its entirety by reference.

TECHNICAL FIELD

The present disclosure generally relates to electronic circuits, and, more specifically, to a current balancing circuit intended for semiconductor components connected in parallel. The present disclosure more specifically relates to power applications.

BACKGROUND

There exist many applications where a current, which is relatively high as compared with the individual currents that different components are capable of withstanding, is applied to a plurality of semiconductor components of a same type assembled in parallel. Such is the case, in particular, for an assembly of power diodes connected in parallel between two terminals of a'high voltage application (e.g., from tens to hundreds of volts). In the conductive state, each diode sees a current smaller than the total current flowing through the assembly. Ideally, the current seen by each diode, or more generally by each semiconductor element, corresponds to the total current divided by the number of components. In practice, technological dispersions or differences in the manufacturing of semiconductor components, manufacturing tolerances, and/or dispersions due to a temperature differences between each component in the application often cause an imbalance of currents between the different components. This may result in a situation where one of the components conducts a current which exceeds the maximum current that it can withstand.

To overcome this issue, the components may be sorted after manufacturing to only assemble in parallel components having characteristic dispersions which are more limited than manufacturing dispersions. Another approach is to oversize the assembly, that is, to assemble in parallel at least one more component than a number n of components which should be provided to withstand the maximum current of the considered application if all components had identical characteristics. However, these two approaches have a non-negligible cost, which is desirable to avoid.

SUMMARY

In accordance with an example embodiment, a circuit is provided for balancing currents flowing through a parallel assembly of semiconductor components of the same type. The circuit may include, for each component, a regulation circuit including a comparator of a first signal representative of the current flowing through the component with a reference signal, and a resistive element of a settable or changeable resistance, controlled by the comparator.

According to an example embodiment, the reference signal may be representative of the total current flowing through the assembly, divided by the number of components. According to another example aspect, in each regulation circuit, the resistive element of changeable resistance is a MOS transistor.

In accordance with another example aspect, in each regulation circuit, the resistive element of changeable resistance may be series-connected with the component having the regulation circuit associated therewith. Each regulation circuit may include a current measurement resistor to be series-connected with the component having the regulation circuit associated therewith. In each regulation circuit, the first signal may be the voltage across the current measurement resistor.

According to another example aspect, in each regulation circuit, the comparator may include an operational amplifier having a first input receiving the first signal and having a second input receiving the reference signal. The circuit may also include a circuit for providing the reference signal and comprising a circuit for summing the first signals provided by the different regulation circuits, and a circuit for dividing an output signal of the summing circuit by the number of components. In accordance with an example embodiment, the summing circuit may comprise at least one operational amplifier. Furthermore, the dividing circuit may comprise a resistive voltage dividing bridge. Additionally, the regulation circuits may be identical to one another.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
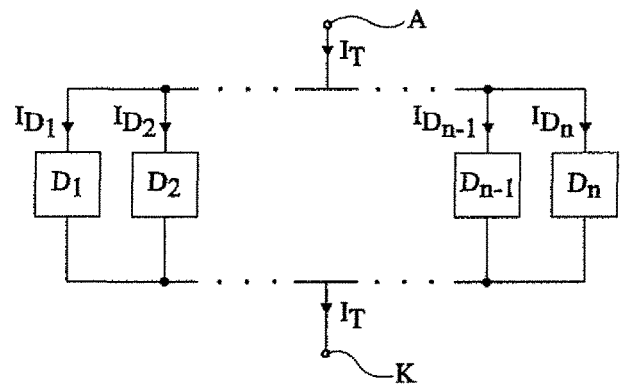
FIG. 1 is a simplified schematic drawing of a parallel association of semiconductor components of the type with which the embodiments described herein may be used.

For clarity, the same elements have been designated with the same reference numerals in the various drawings. Further, only those elements which are useful to the understanding of the described embodiments have been detailed. In particular, the uses which may be made of a parallel assembly of semiconductor components have not been detailed, the described embodiments being compatible with typical applications using a plurality of semiconductor components of the same type connected in parallel.

FIG. 1 is a simplified representation of an assembly of n semiconductor components $D_1, D_2, \ldots D_{n-1}, D_n$, connected in parallel between terminals A and K. Components $D_i$ (i being an integer in the range from 1 to n) are identical, for example, to within manufacturing dispersions or tolerances. In operation, during a phase of turning on the assembly, a current $I_T$ may flow between terminals A and K. Each component $D_i$ then conducts a current $I_{Di}$ smaller than current $I_T$. Applications of such parallel assemblies of semiconductor components include protection devices, AC/DC or DC/DC voltage conversion devices such as high voltage and/or high current switched-mode power supplies (applications such as traction motors, solar inverters, welding machines, embarked charger for an electric or hybrid vehicle . . . ), etc. Components $D_1$ to $D_n$ are, for example, semiconductor diodes, but may more generally be semiconductor components of another type, such as MOS transistors, IGBT transistors, switches, Schottky diodes, Zener diodes, etc.

Figure 2:
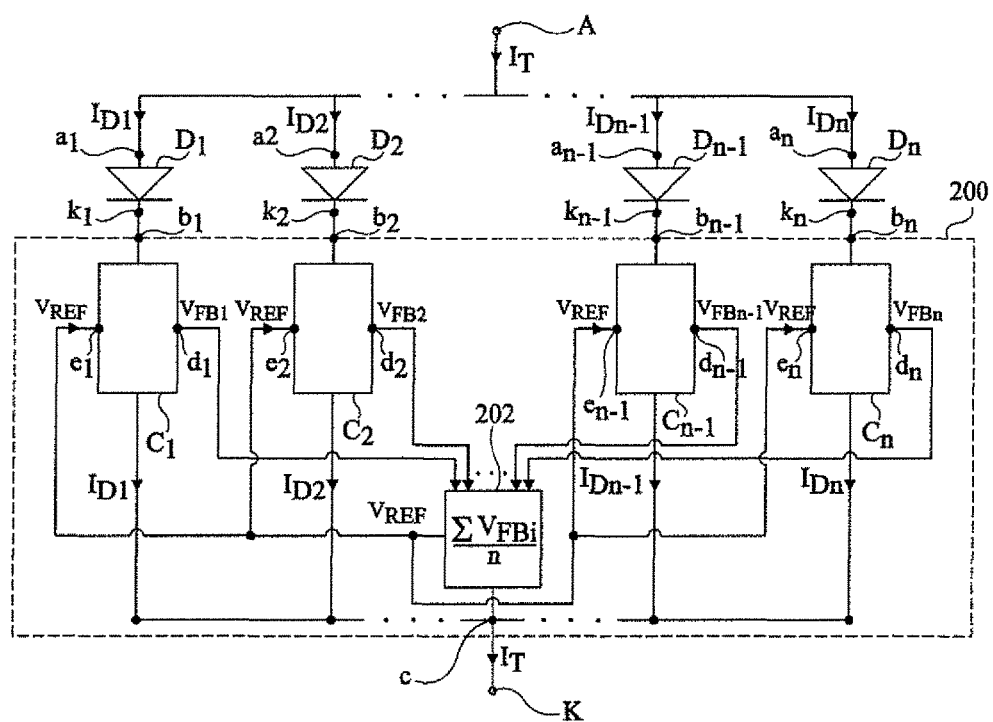
FIG. 2 is a schematic block diagram of an embodiment of a system for balancing the currents flowing through semiconductor elements assembled in parallel.

In an assembly of the type in FIG. 1, dispersions or differences between the different components may result in one or a plurality of components conducting a current greater than the maximum current that the component can withstand. FIG. 2 schematically shows an embodiment of a system including a parallel assembly of n semiconductor components $D_1$ to $D_n$, and a circuit 200 for balancing the currents flowing through components $D_1$ to $D_n$. Each component $D_i$ includes two main conduction terminals $a_i$ and $k_i$. In the illustrated example, each component $D_i$ is a diode, and terminals $a_i$ and $k_i$ respectively correspond to the anode and to the cathode of the diode. Components $D_i$ are connected in parallel between terminals A and K of the assembly, via their conduction terminals $a_i$ and $k_i$. In the illustrated example, each component $D_i$ has its terminal $a_i$ connected to terminal A, and its terminal $k_1$ is connected to terminal K via a balancing circuit 200.

The balancing circuit 200 illustratively includes n connection terminals $b_1$ to $b_n$ respectively connected to the n terminals $k_1$ to $k_n$ of components $D_1$ to $D_n$. In the illustrated example, terminals $b_1$ to $b_n$ are directly connected to terminals $k_1$ to $k_n$, respectively. The balancing circuit 200 further includes an additional connection terminal c connected to terminal K. In the present example, terminal c is directly connected to terminal K.

A circuit 200 includes n current regulation circuits $C_i$ which are, for example, identical or similar. Each circuit $C_i$ is associated with the component $D_i$ of the same rank i. More specifically, each regulation circuit $C_i$ is connected between terminal $b_i$ of the same rank i and terminal c of the balancing circuit 200.

In operation, during a conduction phase of the system, a current $I_T$ may flow between terminals A and K. Each component $D_i$ then conducts a current $I_{Di}$ smaller than current $I_T$. Each regulation circuit $C_i$ conducts, between its nodes of connection to terminals $b_i$ and c, the same current $I_{Di}$ as component $D_i$ associated therewith.

Each regulation circuit $C_i$ includes a node $d_i$ for supplying a signal $V_{FBi}$, representative of current $I_{Di}$ flowing between terminals $b_i$ and c. Each regulation circuit $C_i$ further illustratively includes a node $e_i$ which receives of a reference signal $V_{REF}$, for example, of the same nature as signal $V_{FBi}$. All regulation circuits $C_i$ receive the same reference signal $V_{REF}$ on their respective nodes $e_i$. Each regulation circuit $C_i$ is capable or configured to vary its resistance between terminals $b_i$ and c to modify current $I_{Di}$ to minimize the interval between signal $V_{FBi}$ and $V_{REF}$.

Balancing circuit 200 further includes a circuit 202 for providing the reference signal $V_{REF}$. The circuit 202 includes n input nodes respectively connected to nodes $d_1$ to $d_n$ of circuits $C_1$ to $C_n$. The circuit 202 further includes a node for supplying signal $V_{REF}$ and connected to the n nodes $e_1$ to $e_n$ of circuits $C_1$ to $C_n$. The circuit 202 is capable of or configured to supply a signal $V_{REF}$ equal to the sum of the n signals $V_{FBi}$ applied to its input nodes, divided by number n of components $D_i$ of the assembly.

Thus, the circuit 200 is capable of or configured to measure, in each branch of the parallel assembly of components $D_1$ to $D_n$, a variable representative of current $I_{Di}$ flowing through the branch, and measure this variable with a variable representative of the total current $I_T$ divided by number n of components. It is further configured to accordingly modify the resistance of the branch to balance the different currents $I_{Di}$ of the assembly. The system control results in that, in each branch of the assembly, current $I_{Di}$ of the branch tends, for a balanced system, towards a value $I_T/n$.

Figure 3:
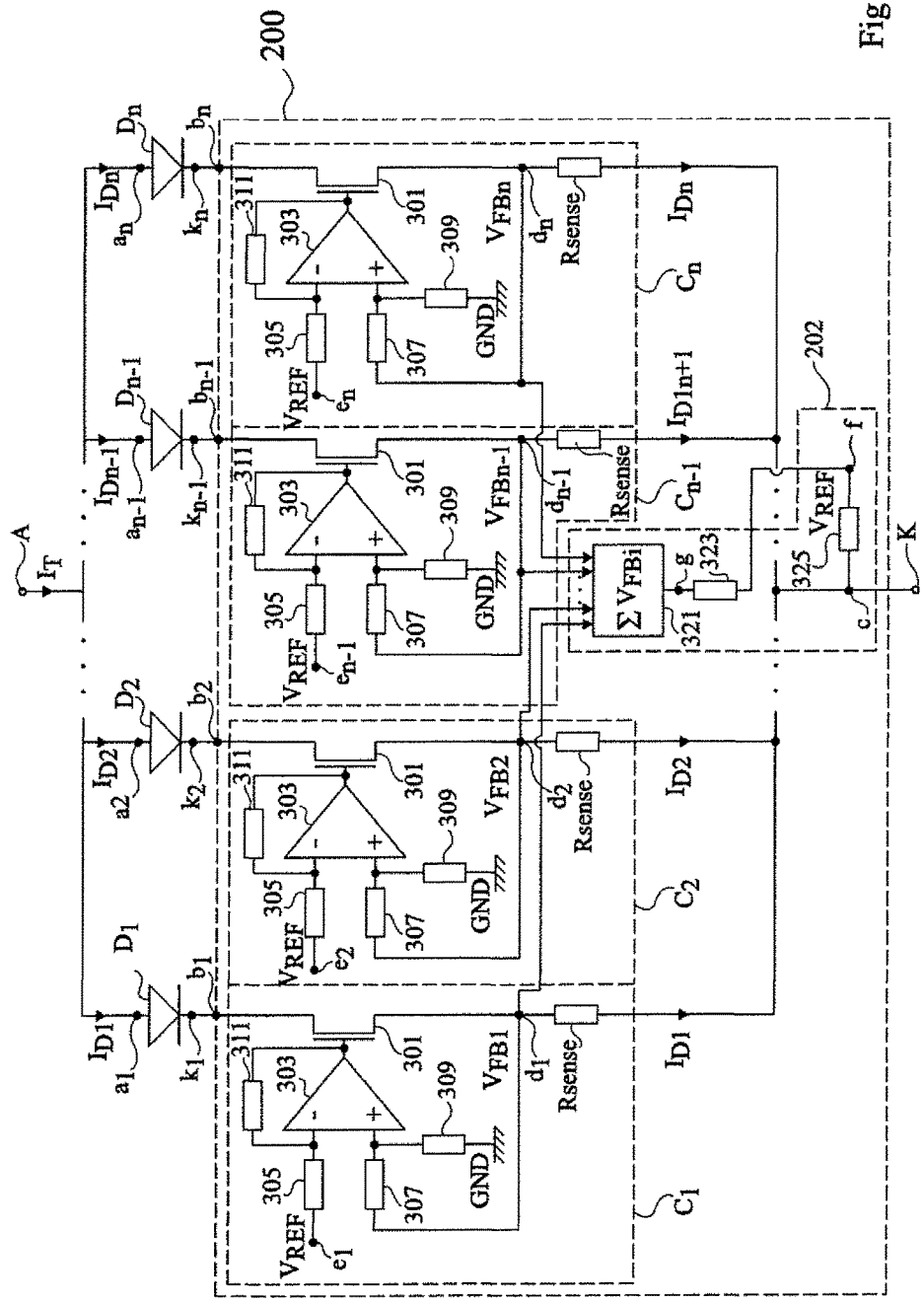
FIG. 3 is a schematic circuit diagram of the system of FIG. 2, illustrating in greater detail an example embodiment of a balancing circuit.

FIG. 3 is an electrical circuit diagram of the system of FIG. 2, illustrating in more detailed fashion an embodiment of the balancing circuit 200. In this example, each circuit $C_i$ includes, in series between terminal $b_i$ and terminal c, an element of settable resistance 301 and a resistive element $R_{sense}$ for measuring current $I_{Di}$. In the illustrated example, element 301 is a MOS transistor having a resistance which may be set by application of a setting voltage on its control gate. As a variation, the element 301 may be a bipolar transistor or any other element having a settable or changeable resistance. In the present description, although resistive elements $R_{sense}$ of the resistors will be taken as an example, these resistors may take different forms, including that of MOS transistors.

In the illustrated example, the element 301 is connected between nodes $b_i$ and $d_i$ of circuit $C_i$, and the element $R_{sense}$ is connected between node $d_i$ of circuit $C_i$ and terminal c. Thus, in this example, information $V_{FBi}$ provided on node $d_i$ of circuit $C_i$ is the voltage on node $d_i$, or the voltage across resistor $R_{sense}$, which is proportional to the current $I_{Di}$ flowing in the branch including, in series between terminals A and K, component $D_i$, settable resistance element 301, and resistive measurement element $R_{sense}$.

In the example of FIG. 3, each circuit $C_i$ illustratively includes an operational amplifier 303 assembled as an analog voltage comparator. The amplifier 303 has an inverting input (−) connected to node $e_i$ of application of signal $V_{REF}$ via a resistor 305, and a non-inverting input (+) connected to node $d_i$ for providing signal $V_{FBi}$ via a resistor 307. A resistor 309 is further connected between the non-inverting input (A) of the amplifier 303 and a node GND of application of a reference potential, e.g., connected to terminal K. Further, a resistor 311 is connected between the inverting input (−) of the amplifier 303 and the output of the amplifier. Resistors 305 and 307, on the one hand, and 309 and 311, on the other hand, preferably have the same values. Thus, amplifier 303 provides an output signal proportional to the difference between voltages $V_{FBi}$ and $V_{REF}$. The output of amplifier 303 is connected to a control node of the transistor 301.

In this example, the MOS transistor 301 operates in a linear mode, that is, the control signal applied to the gate of the transistor 301 varies the on-state series resistance of the transistor 301. The function of the amplifier 303, which is configured as a comparator, r is to apply to the control gate of the transistor 301 a signal tending to increase the resistance of the transistor 301 (and thus decrease current $I_{Di}$) if the signal $V_{FBi}$ is greater than the reference signal $V_{REF}$, and to decrease the resistance of the transistor 301 (and thus increase the current $I_{Di}$) if the signal $V_{FBi}$ is smaller than signal $V_{REF}$.

In the example of FIG. 3, the circuit 202 for generating the signal $V_{REF}$ includes a circuit 321 for summing voltages $V_{FBi}$ sampled from nodes $d_i$ of circuits $C_i$. The circuit 321 supplies, on a node g, a voltage equal to the sum of voltages $V_{FBi}$. The circuit 321 may include one or more operational amplifiers (not shown).

The circuit 202 further includes, between node g and node c, a resistor 323 in series with a resistor 325. The junction point of resistors 323 and 325 is connected to node f for supplying the signal $V_{REF}$.

The resistors 323 and 325 of the circuit 202 form a voltage-dividing bridge. Thus, the voltage $V_{REF}$ provided on the node f of the circuit 202 is equal to the voltage applied to the node g (that is, the sum of voltages $V_{FBi}$), divided by a coefficient $(R_{323}+R_{325})/R_{325}$, where $R_{323}$ and $R_{325}$ respectively designate the value of resistor 323 and the value of resistor 325. In this example, the resistors 323 and 325 are selected to be such that $n=(R_{323}+R_{325})/R_{325}$, n being the number of components $D_i$ connected to the balancing circuit 200.

As a non-limiting example, the circuit 200 may be made in the form of an integrated circuit on a semiconductor chip including n+1 terminals connected to the parallel assembly of components $D_i$ (terminals $b_1$ to $b_n$ and terminal c). As a variation, the elements of the circuit 200 may be integrated on a same semiconductor chip, except for the resistor 325, which may be a discrete resistor external to the integrated circuit. In this case, the semiconductor chip may include n+2 connection terminals (terminals $b_1$ to $b_n$, terminal c, and terminal f). This makes it possible to adjust the value of the resistor 325 according to the given application, particularly if the number of branches of the parallel assembly of components $D_i$ is desired to be modified.

An advantage of the embodiment of FIG. 3 is that the cost, the bulk, and the consumption of the balancing circuit 200 are relatively low. In particular, the MOS transistors 301 may be low-voltage transistors. Indeed, in the non-conductive state of the assembly (i.e., when a negative voltage is applied between terminals A and K of the assembly), each transistor 301 is conductive due to the body diode of this transistor. The voltage is thus not withstood by the transistors 301, but by the components $D_i$. Further, the power consumption of the transistors 301 of the balancing circuit only occurs in the presence of an imbalance of currents $I_{Di}$. Further, the resistors $R_{sense}$ may be of low value, for example, of a value in the range from 10 to 100 mΩ, and may result in only a relatively small energy dissipation or consumption.

While specific embodiments have been described above, various alterations, modifications, and improvements will readily occur to those skilled in the art. In particular, the described embodiments are not limited to the specific example of the balancing circuit shown in FIG. 3. As a variation, in each regulation circuit $C_i$, information $V_{FBI}$ representative of the current $I_{Di}$ flowing through the component $D_i$ may be a current, for example, obtained by a current mirror. In this case, the summing performed in the circuit 202 may be a summing of currents and signal $V_{REF}$ may also be a current.

Further, it will be within the abilities of those skilled in the art to adapt the described embodiments to the case where the semiconductor components $D_i$ will have nominal characteristics different from one another. In this case, the values of the different resistors may be adapted. In particular, in the example of FIG. 3, the different circuits $C_i$ may include one or more of the resistors $R_{sense}$, resistors 305, resistors 307, resistors 309, and/or resistors 311 having different values.

Such alterations, modifications, and improvements are intended to be part of this disclosure, and are intended to be within the spirit and the scope of the present invention. Accordingly, the foregoing description is by way of example only and is not intended to be limiting.

That which is claimed is:

1. A circuit for balancing currents flowing through a parallel-connected assembly of semiconductor components of the same type, the circuit comprising:
   a reference voltage signal generator configured to generate a reference signal; and
   a respective regulation circuit for each semiconductor component, each respective regulation circuit comprising
   a resistive element having a changeable resistance, and
   a comparator configured to compare a first signal representative of a current flowing through the respective semiconductor component with a reference signal, and to change the changeable resistance of the resistive element based thereon, wherein the reference signal is directly provided from the reference voltage signal generator to each regulation circuit, and wherein the reference signal is based on a sum of first signals from the respective regulation circuits, wherein the reference voltage signal generator comprises:
   a summing circuit configured to sum the first signals from the regulation circuits; and
   a division circuit configured to divide an output signal of the summing circuit by a number of semiconductor components of the parallel-connected assembly to generate the reference signal.

2. The circuit of claim 1, wherein the reference signal is representative of a total current flowing through the parallel-connected assembly divided by a number of the semiconductor components.

3. The circuit of claim 1, wherein the resistive element comprises a MOS transistor.

4. The circuit of claim 1, wherein the resistive element is to be series-connected with its respective semiconductor component.

5. The circuit of claim 1, wherein each regulation circuit further comprises a current measurement resistor to be series-connected with the respective semiconductor component; and wherein, in each regulation circuit, the first signal is a voltage across the current measurement resistor.

6. The circuit of claim 1, wherein each comparator comprises an operational amplifier having a first input receiving the first signal and a second input receiving the reference signal.

7. The circuit of claim 1, wherein the summing circuit comprises at least one operational amplifier.

8. The circuit of claim 1, wherein the division circuit comprises a resistive voltage-dividing bridge.

9. The circuit of claim 1, wherein the regulation circuits are identical to one another.

10. An electronic device comprising:
    an assembly of a plurality of parallel-connected semiconductor components of a same type;
    a reference voltage signal generator having an output, the reference voltage signal generator configured to generate a reference signal at the output of the reference voltage signal generator; and
    a respective regulation circuit for each semiconductor component, each respective regulation circuit directly connected to the output of the reference voltage signal generator, each respective regulation circuit comprising
    a resistive element having a changeable resistance, and
    a comparator configured to compare a first signal representative of a current flowing through the respective semiconductor component with the reference signal, and to change the changeable resistance of the resistive element based thereon, wherein the reference signal is based on a sum of first signals from the respective regulation circuits, wherein the reference voltage signal generator comprises:
    a summing circuit configured to sum the first signals from the regulation circuits; and a division circuit configured to divide an output signal of the summing circuit by a number of semiconductor components of the parallel-connected assembly to generate the reference signal.

11. The electronic device of claim 10, wherein the reference signal is representative of a total current flowing through the assembly divided by a number of the semiconductor components.

12. The electronic device of claim 10, wherein each resistive element comprises a MOS transistor.

13. The electronic device of claim 10, wherein each resistive element is series-connected with its respective semiconductor component.

14. The electronic device of claim 10, wherein each regulation circuit further comprises a current measurement resistor series-connected with its respective semiconductor component, and wherein in each regulation circuit, the first signal is a voltage across the current measurement resistor.

15. The electronic device of claim 10, wherein each comparator comprises an operational amplifier having a first input receiving the first signal and a second input receiving the reference signal.

16. A method for balancing currents flowing through a parallel-connected assembly of semiconductor components of a same type, with a respective resistive element having a changeable resistance coupled to each of the semiconductor components, the method comprising:
    summing currents flowing through each of the parallel-connected assembly of semiconductor components using a summing circuit to obtain a total current;
    dividing an output signal of the summing circuit by a number of semiconductor components to generate a reference signal based on the total current using a division circuit;
    directly providing the reference signal from the division circuit to a comparison circuit;
    comparing, with the comparison circuit, a first signal representative of a current flowing through a respective semiconductor component with the reference signal; and
    changing the changeable resistance of the respective resistive element based upon the comparison.

17. The method of claim 16, wherein the reference signal is representative of a total current flowing through the parallel-connected assembly divided by a number of the semiconductor components.

18. The method of claim 16, wherein each resistive element comprises a MOS transistor.

19. The method of claim 16, wherein each resistive element is series-connected with its respective semiconductor component.

20. The circuit of claim 1, wherein the resistive element comprises a transistor having a control terminal coupled to an output of the comparator, a first load path terminal coupled to the respective semiconductor component, and a second load path terminal coupled to a sense resistor, the comparator comprising a negative input configured to receive the reference signal, and a positive input configured to receive the first signal.

21. The circuit of claim 20, wherein the negative input is coupled to the output of the comparator via a first resistor, and the positive input is coupled to a feedback node via a second resistor, the feedback node coupled between the second load path terminal of the transistor and the sense resistor.

* * * * *